United States Patent
Woo et al.

(10) Patent No.: US 7,619,891 B2
(45) Date of Patent: Nov. 17, 2009

(54) PLASMA DISPLAY APPARATUS

(75) Inventors: Seok-Gyun Woo, Suwon-si (KR); Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 693 days.

(21) Appl. No.: 11/220,721

(22) Filed: Sep. 8, 2005

(65) Prior Publication Data
US 2006/0061968 A1    Mar. 23, 2006

(30) Foreign Application Priority Data
Sep. 21, 2004   (KR) ............. 10-2004-0075483

(51) Int. Cl.
- H05K 7/20 (2006.01)
- H05K 5/00 (2006.01)
- H04N 5/74 (2006.01)
- G09G 3/10 (2006.01)
- B32B 3/26 (2006.01)

(52) U.S. Cl. .......... 361/707; 361/704; 361/752; 348/E3.014; 348/748; 345/41; 428/304.4

(58) Field of Classification Search ........ 361/704, 361/707, 748, 752; 348/E3.014, 748; 345/41; 428/304.4
See application file for complete search history.

(56) References Cited

U.S. PATENT DOCUMENTS

| | | | |
|---|---|---|---|
| 5,831,374 A * | 11/1998 | Morita et al. ........ 313/46 |
| 6,714,418 B2 * | 3/2004 | Frankowsky et al. ........ 361/735 |
| 6,737,790 B2 * | 5/2004 | Seki ........ 313/47 |
| 7,133,281 B2 * | 11/2006 | Bae ........ 361/679.21 |
| 7,164,586 B2 * | 1/2007 | Lin ........ 361/714 |
| 2003/0017320 A1 * | 1/2003 | Ebihara et al. ........ 428/306.6 |
| 2003/0020152 A1 * | 1/2003 | Inoue et al. ........ 257/684 |
| 2003/0128503 A1 * | 7/2003 | Takahashi ........ 361/681 |
| 2004/0119410 A1 * | 6/2004 | Jun et al. ........ 313/582 |
| 2004/0196277 A1 * | 10/2004 | Kawaguchi et al. ........ 345/211 |
| 2004/0212554 A1 * | 10/2004 | Kim et al. ........ 345/41 |
| 2005/0067963 A1 * | 3/2005 | Kim et al. ........ 313/583 |
| 2005/0117304 A1 * | 6/2005 | Kim ........ 361/704 |
| 2005/0174301 A1 * | 8/2005 | Kim ........ 345/3.1 |
| 2005/0212426 A1 * | 9/2005 | Ahn ........ 313/582 |
| 2005/0270436 A1 * | 12/2005 | Miyamura et al. ........ 349/58 |
| 2006/0012962 A1 * | 1/2006 | Obata ........ 361/704 |
| 2006/0044745 A1 * | 3/2006 | Kim ........ 361/681 |

FOREIGN PATENT DOCUMENTS

| KR | 1020030006964 A1 | 1/2003 |
|---|---|---|
| KR | 100385296 B1 | 5/2003 |

* cited by examiner

Primary Examiner—Jayprakash N Gandhi
Assistant Examiner—Bradley H Thomas
(74) Attorney, Agent, or Firm—H.C. Park & Associates, PLC

(57) ABSTRACT

A plasma display apparatus including a plasma display panel displaying images, a chassis base arranged behind the plasma display panel, and a heat conductive member and a porous adiabatic member arranged between the plasma display panel and the chassis base.

20 Claims, 5 Drawing Sheets

FRONT ←——→ REAR

FRONT ←——→ REAR

PLASMA DISPLAY APPARATUS

CROSS-REFERENCE TO RELATED APPLICATION

This application claims priority to and the benefit of Korean Patent Application No. 10-2004-0075483, filed on Sep. 21, 2004, which is hereby incorporated by reference for all purposes as if fully set forth herein.

BACKGROUND OF THE INVENTION

1. Field of the Invention

The present invention relates to a plasma display apparatus, and more particularly, to a plasma display apparatus having an improved structure for dissipating heat from a plasma display panel and reducing noise.

2. Discussion of the Background

Generally, a plasma display apparatus is a flat panel display that displays images using gas discharge, and it is considered as a next generation display to replace the cathode ray tube (CRT) because it has excellent display characteristics including it may have a large screen that displays bright images and has a wide viewing angle.

The plasma display apparatus includes a plasma display panel, a chassis base disposed parallel to the plasma display panel, a circuit board mounted on a rear portion of the chassis base to drive the plasma display panel, and a case housing the plasma display panel, the chassis base, and he circuit board.

Since the plasma display panel displays an image using gas discharge, it generates a lot of heat. The heat degrades the plasma display panel's performance, and the reliability of the circuit board may degrade if the plasma display panel is driven for a long time. Therefore, in order to efficiently dissipate heat generated by the plasma display panel, a heat conductive medium may be installed between the plasma display panel and the chassis base.

The heat conductive medium should adequately dissipate heat. If it does not adequately dissipate heat, uneven heat distribution on the plasma display panel is not removed rapidly. Thus, fluorescent material of phosphor layers at a region where heat accumulates may be degraded and a residual image may be generated.

Additionally, in the plasma display panel, a discharge operation is performed to display the image. However, the discharge may generate vibration, which transmits outside the apparatus and causes noise. Particularly in an alpine region, the vibration may be more severe at the front portion of the plasma display panel than at the rear portion, which decreases the reliability of the plasma display apparatus.

SUMMARY OF THE INVENTION

The present invention provides a plasma display apparatus capable of dissipating heat sufficiently from a plasma display panel and reducing noise by disposing a heat conductive member and a porous adiabatic member between a plasma display panel and a chassis base.

Additional features of the invention will be set forth in the description which follows, and in part will be apparent from the description, or may be learned by practice of the invention.

The present invention discloses a plasma display apparatus including a plasma display panel displaying images, a chassis base arranged behind the plasma display panel, and a heat conductive member and a porous adiabatic member arranged between the plasma display panel and the chassis base.

The present invention also discloses a plasma display apparatus including a plasma display panel displaying images, a chassis base arranged behind the display panel, a porous adiabatic member arranged between and substantially parallel to the plasma display panel and the chassis base, a heat conductive member arranged between and substantially parallel to the porous adiabatic member and the plasma display panel, and covering at least a portion of the porous adiabatic member, and a circuit board disposed on a rear portion of the chassis base.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
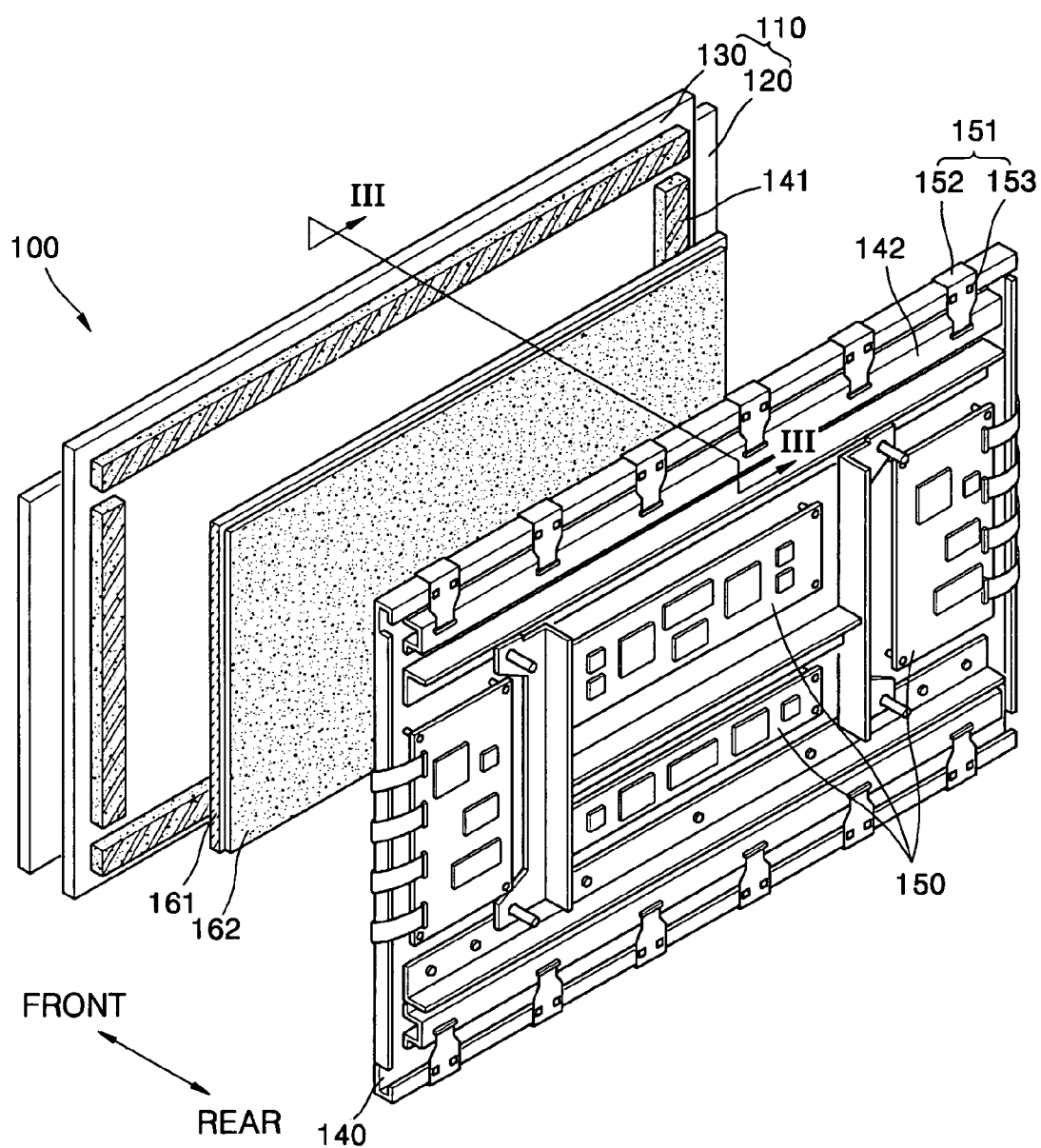
FIG. 1 is an exploded perspective view showing a plasma display apparatus according to an exemplary embodiment of the present invention.
Figure 2:
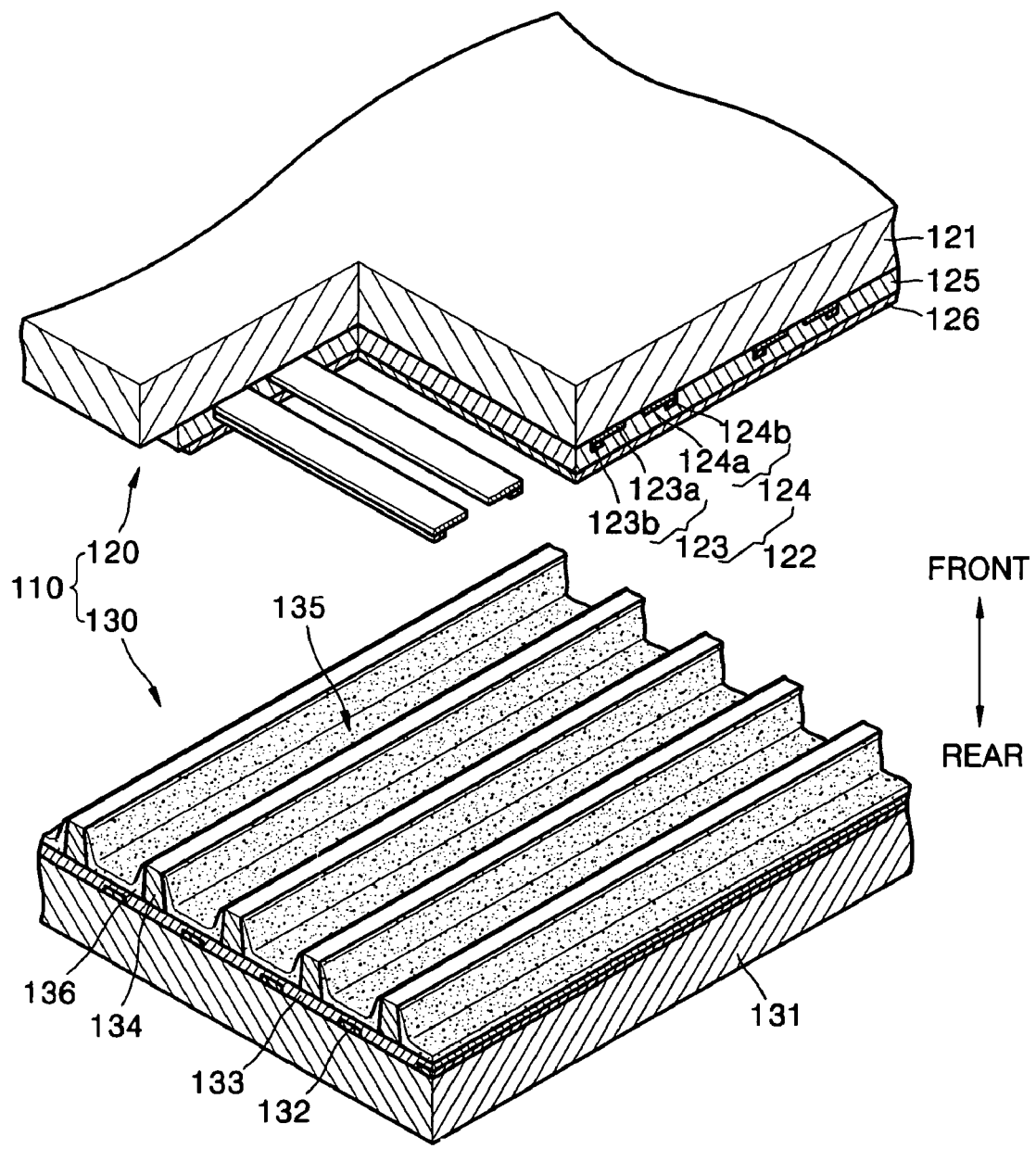
FIG. 2 is a partial perspective view showing a plasma display panel of FIG. 1.
Figure 3:
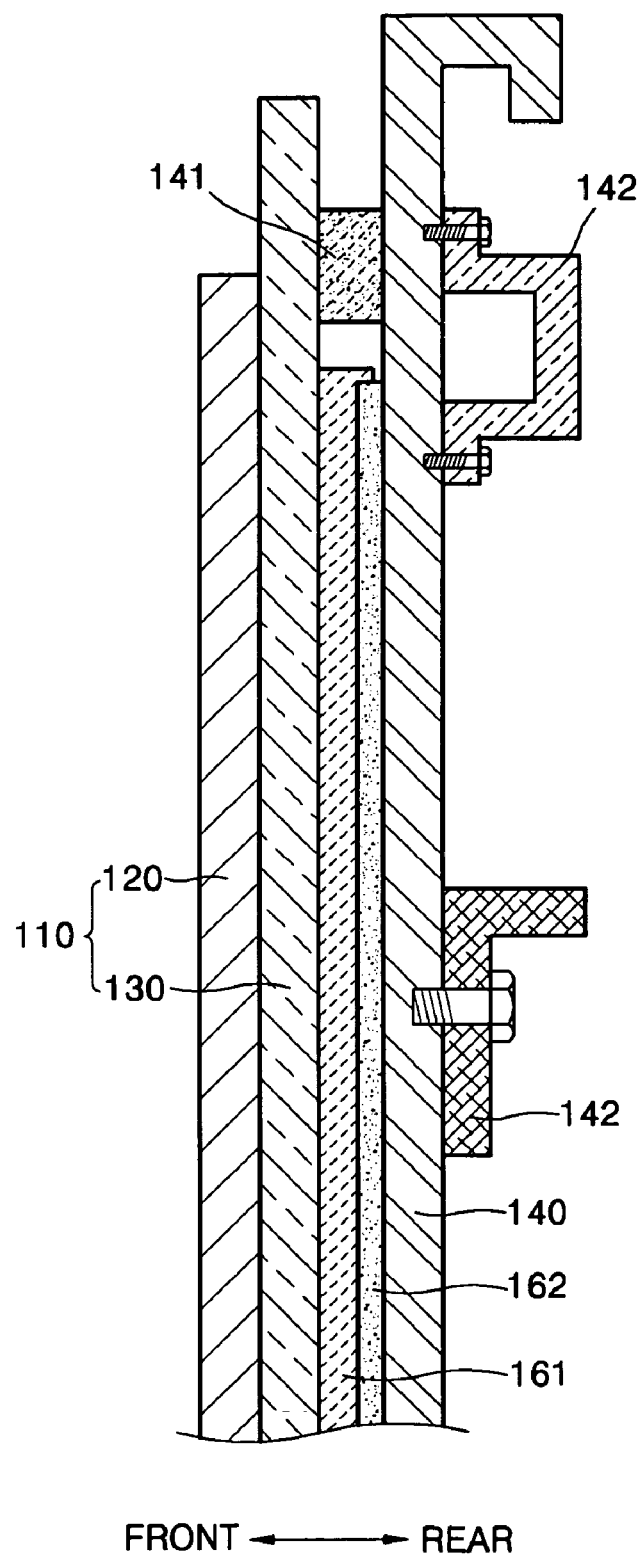
FIG. 3 is a partial cross-sectional view of the plasma display panel along line III-III of FIG. 1.

FIG. 1 is an exploded perspective view showing a plasma display apparatus according to an exemplary embodiment of the present invention, and FIG. 2 is a partial perspective view showing a plasma display panel of FIG. 1. FIG. 3 is a partial cross-sectional view of the plasma display panel along line III-III of FIG. 1.

Referring to FIG. 1, the plasma display apparatus 100 includes a plasma display panel 110 for displaying images.

Various types of plasma display panels may be used as the plasma display panel 110. For example, as shown in FIG. 2, an alternating current (AC) plasma display panel having a three-electrode surface discharge structure may be used.

The plasma display panel 110 of FIG. 2 includes a front panel 120 and a back panel 130 coupled to the front panel 120.

The front panel 120 includes a front substrate 121, sustain electrode pairs 122 formed on a back surface of the front substrate 121 and including X electrodes 123 and Y electrodes 124, a front dielectric layer 125 covering the sustain electrode pairs 122, and a protective layer 126 covering the front dielectric layer 125. The X electrode 123 serves as a common electrode, and the Y electrode 124 serves as scan electrode. A discharge gap separates the X and Y electrodes. Additionally, the X electrode 123 includes a transparent electrode 123a and a bus electrode 123b coupled to the transparent electrode 123a, and the Y electrode 124 includes a transparent electrode 124a and a bus electrode 124b coupled to the transparent electrode 124a.

The back panel 130 includes a back substrate 131, address electrodes 132 formed on a front surface of the back substrate 131 and extending in a direction crossing the sustain electrode pairs 122, a back dielectric layer 133 covering the address electrodes 132, barrier ribs 134 formed on the back dielectric layer 133 to define discharge spaces 135, a phosphor layer 136 disposed in the discharge spaces 135, and a discharge gas filled in the discharge spaces 135. The barrier ribs 134 extend parallel to the address electrodes 132, and at least one address electrode 132 is disposed between adjacent barrier ribs 134. Therefore, regions where the sustain electrode pairs 122 and the address electrodes 132 cross each other correspond to the discharge spaces 135.

Referring to FIG. 1 and FIG. 3, a chassis base 140 is arranged behind the plasma display panel 110, and the plasma display panel 110 and the chassis base 140 may be coupled to each other by a coupling member 141. For example, the coupling member 141 may be dual-adhesive tape arranged along edges of the panel 110 and the chassis base 140. The chassis base 140 may be formed of a material such as aluminium. An end portion of the chassis base 140 may be bent toward the rear portion to prevent the chassis base 140 from bending or curving, and a plurality of reinforcing members 142 may be installed on the rear portion of the chassis base 140.

Additionally, circuit boards 150 are installed on the rear portion of the chassis base 140. The circuit boards 150 include devices for driving the plasma display panel 110, and the devices may include devices supplying voltages to the plasma display panel 110 and devices applying signals for displaying images on the plasma display panel 110.

A signal transmission member transmits electric signals of the circuit boards 150 to the plasma display panel 110. The signal transmission member may comprise a tape carrier package (TCP) 151, which may be formed as a package by mounting at least a device 153, for example, a driving integrated circuit (IC), onto a tape-type wiring portion 152. The plasma display panel 110, the chassis base 140, and the circuit boards 150 are housed in a case (not shown) having a front cover and a back cover.

A heat conductive member 161 and a porous adiabatic member 162 are arranged between the plasma display panel 110 and the chassis base 140. For example, the heat conductive member 161 and the porous adiabatic member 162 may be arranged in the space defined by the coupling member 141 between the plasma display panel 110 and the chassis base 140.

The heat conductive member 161 is formed of a flexible material having high heat conductivity, such as, for example, silicon, and it may be formed as a single plate-shaped piece or a plurality of plate-shaped pieces. The heat conductive member 161 may be arranged adjacent to, and substantially in parallel with, the plasma display panel 110. Additionally, the heat conductive member 161 is arranged adjacent to the coupling member 141. Since the heat conductive member 161 has high heat conductivity, heat generated while driving the plasma display panel 110 may be distributed in a direction of the entire plane of the plasma display panel 110. Accordingly, heat distribution on the plasma display panel 110 may be uniform. Thus, a residual image caused by degraded fluorescent material that is generated on a region where heat accumulates or a brightness level difference may be reduced.

Additionally, since the heat conductive member 161 is flexible, it may be adhered onto the back surface of the plasma display panel 110 including even on a rough portion of the surface. Here, an adhesive material may be applied on the surface of the heat conductive member 161 that faces the plasma display panel 110 in order to firmly couple the heat conductive member 161 with the plasma display panel 110.

Accordingly, vibration and noise generated if the heat conductive member 161 comes off the plasma display panel 110 may be prevented, and the heat conductive member 161 may absorb vibration and noise generated by the plasma display panel 110. Moreover, the heat conductive member 161 may absorb external vibration or shock that can be generated while moving the plasma display apparatus 100, thus protecting the plasma display panel 110.

Figure 4:
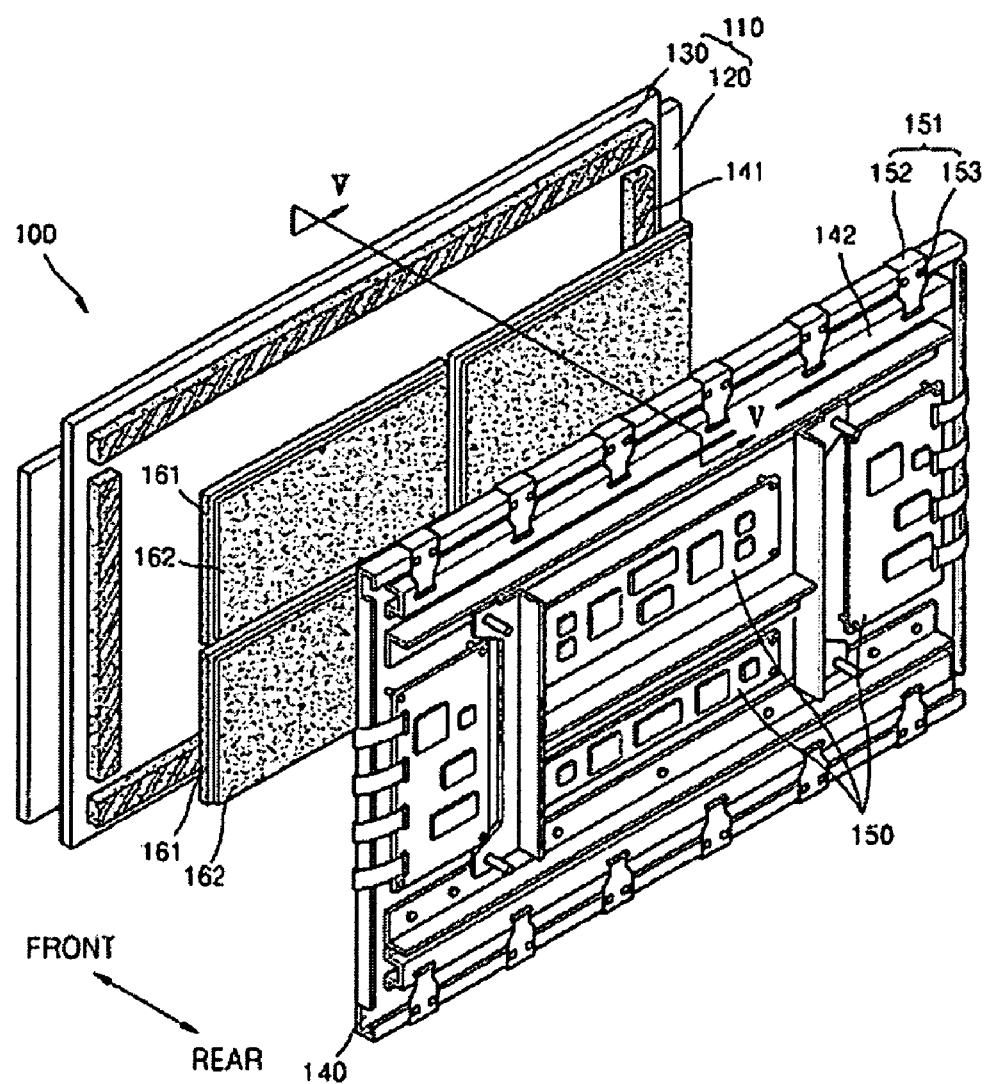
FIG. 4 is an exploded perspective view showing a plasma display apparatus according to another exemplary embodiment of the present invention.
Figure 5:
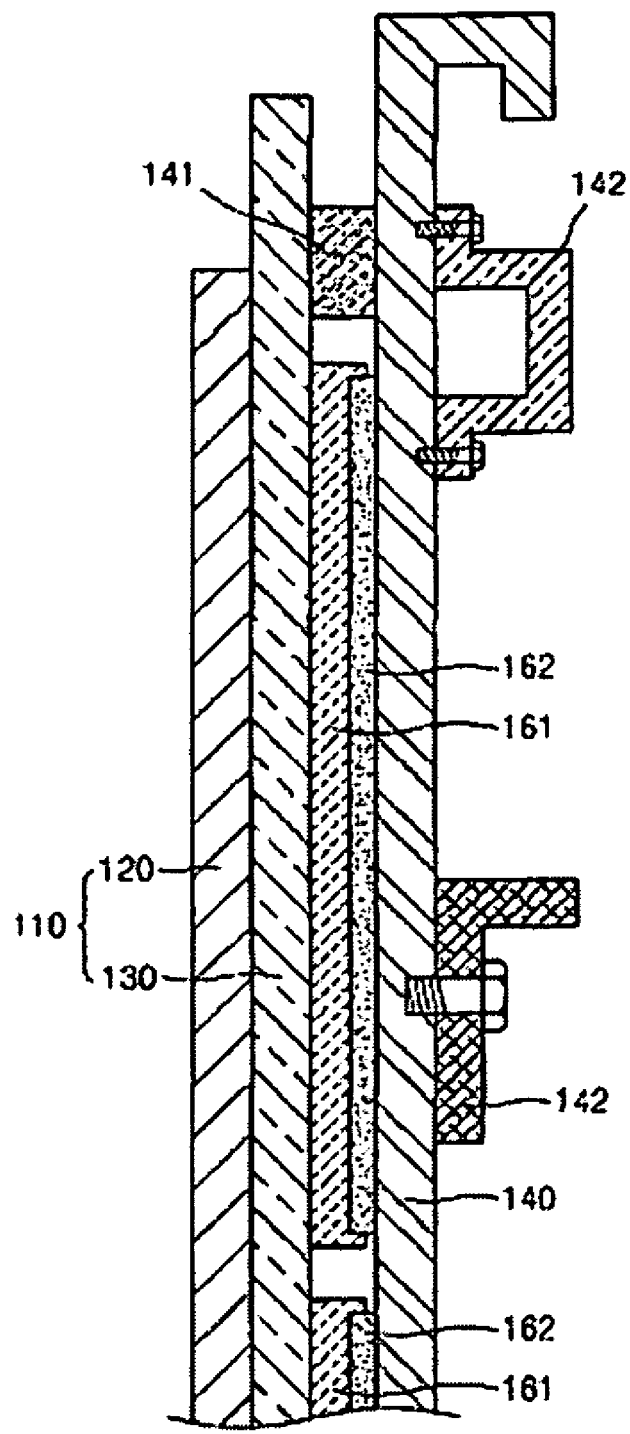
FIG. 5 is a partial view of the plasma display along line V-V of FIG. 4.

The porous adiabatic member 162 may be formed using a porous material, such as, for example, urethane foam, and it may be formed as a single plate-shaped piece (see FIG. 1 and FIG. 3) or a plurality of plate-shaped pieces (see FIG. 4 and FIG. 5). The porous adiabatic member 162 has approximately the same area as that of the heat conductive member 161, and it may be arranged adjacent to, and substantially parallel with, the chassis base 140. That is, the porous adiabatic member 162 prevents heat generated by the circuit boards 150 from transmitting to the plasma display panel 110. Additionally, the porous adiabatic member 162 includes a plurality of pores, which may absorb noise generated inside the plasma display apparatus. Accordingly, noise generated inside the plasma display apparatus may not be discharged out of the apparatus, especially, to the front portion of the plasma display panel 110 in an alpine region. The porous adiabatic member 162 absorbs external vibration or shock together with the heat conductive member 161 when moving the plasma display apparatus 100, thus protecting the plasma display panel 110.

The heat conductive member 161 may be formed to cover at least a portion of the porous adiabatic member 162. Specifically, the silicon forming the heat conductive member 161 may be absorbed into the urethane foam forming the porous adiabatic member 162, thus these two members may be more firmly coupled to each other. Alternatively, the heat conductive member 161 and the porous adiabatic member 162 may be coupled to each other by an adhesive material disposed therebetween.

According to an exemplary embodiment of the present invention, the heat conductive member having high heat conductivity is installed on the back surface of the plasma display panel. Thus, heat may be rapidly and sufficiently dissipated from the plasma display panel. Therefore, the residual image or the brightness level difference generated due to uneven heat distribution may be prevented.

Additionally, since the porous adiabatic member is arranged on the front surface of the chassis base, heat may be prevented from transmitting from the circuit boards to the plasma display panel, and noise generated by the plasma display panel may be absorbed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
a plasma display panel to display images;
a chassis base arranged behind the plasma display panel;
a coupling member disposed along portions of the perimeter of the plasma display panel;
a heat conductive member; and
a porous adiabatic member, wherein the heat conductive member and the porous adiabatic member are arranged between the plasma display panel and the chassis base and in a region defined by the coupling member.

2. The plasma display apparatus of claim 1, wherein the heat conductive member is arranged adjacent to the plasma display panel, and the porous adiabatic member is arranged adjacent to the chassis base.

3. The plasma display apparatus of claim 1, wherein the heat conductive member covers at least a portion of the porous adiabatic member.

4. The plasma display apparatus of claim 3, wherein the heat conductive member comprises silicon.

5. The plasma display apparatus of claim 4, wherein the porous adiabatic member comprises urethane foam.

6. The plasma display apparatus of claim 1, further comprising a circuit board arranged on a rear portion of the chassis base.

7. The plasma display apparatus of claim 1, wherein the heat conductive member comprises a single plate-shaped piece.

8. The plasma display apparatus of claim 1, wherein the heat conductive member comprises a plurality of plate-shaped pieces.

9. The plasma display apparatus of claim 1, wherein the porous adiabatic member comprises a single plate-shaped piece.

10. The plasma display apparatus of claim 1, wherein the porous adiabatic member comprises a plurality of plate-shaped pieces.

11. The plasma display apparatus of claim 1, wherein the plasma display panel, the chassis base, the heat conductive member, and the porous adiabatic member are arranged parallel to each other.

12. The plasma display apparatus of claim 1, wherein the coupling member contacts both the plasma display panel and the chassis base.

13. A plasma display apparatus, comprising:
a plasma display panel to display images;
a chassis base arranged behind the plasma display panel;
a coupling member disposed along portions of the perimeter of the plasma display panel;
a porous adiabatic member arranged between and parallel to the plasma display panel and the chassis base and in a region defined by the coupling member;
a heat conductive member arranged between and parallel to the porous adiabatic member and the plasma display panel, and covering at least a portion of the porous adiabatic member; and
a circuit board disposed on a rear portion of the chassis base.

14. The plasma display apparatus of claim 13, wherein the porous adiabatic member comprises urethane foam.

15. The plasma display apparatus of claim 14, wherein the heat conductive member comprises silicon.

16. The plasma display apparatus of claim 13, wherein the heat conductive member comprises a single plate-shaped piece.

17. The plasma display apparatus of claim 13, wherein the heat conductive member comprises a plurality of plate-shaped pieces.

18. The plasma display apparatus of claim 13, wherein the porous adiabatic member comprises a single plate-shaped piece.

19. The plasma display apparatus of claim 13, wherein the porous adiabatic member comprises a plurality of plate-shaped pieces.

20. The plasma display apparatus of claim 13, wherein the coupling member contacts both the plasma display panel and the chassis base.

* * * * *

UNITED STATES PATENT AND TRADEMARK OFFICE
CERTIFICATE OF CORRECTION

PATENT NO. : 7,619,891 B2 Page 1 of 1
APPLICATION NO. : 11/220721
DATED : November 17, 2009
INVENTOR(S) : Woo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1103 days.

Signed and Sealed this

Twenty-sixth Day of October, 2010

David J. Kappos
*Director of the United States Patent and Trademark Office*